(12) United States Patent
Togami et al.

(10) Patent No.: US 8,172,469 B2
(45) Date of Patent: May 8, 2012

(54) ELECTROMAGNETIC INTERFERENCE CONTAINMENT STRUCTURES

(75) Inventors: Chris Togami, San Jose, CA (US); Gary Dean Sasser, San Jose, CA (US); Kai F Ng, Mountain View, CA (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 12/952,107

(22) Filed: Nov. 22, 2010

(65) Prior Publication Data

US 2011/0064365 A1 Mar. 17, 2011

Related U.S. Application Data

(62) Division of application No. 12/348,767, filed on Jan. 5, 2009, now Pat. No. 7,837,399.

(60) Provisional application No. 61/019,168, filed on Jan. 4, 2008, provisional application No. 61/019,170, filed on Jan. 4, 2008, provisional application No. 61/019,173, filed on Jan. 4, 2008, provisional application No. 61/019,177, filed on Jan. 4, 2008.

(51) Int. Cl.
*G02B 6/36* (2006.01)
*G02B 6/12* (2006.01)

(52) U.S. Cl. .......................................... 385/92; 385/14

(58) Field of Classification Search .................... 385/14, 385/92
See application file for complete search history.

(56) References Cited

U.S. PATENT DOCUMENTS

| 5,337,396 | A  | * | 8/1994  | Chen et al.    | 385/92  |
|-----------|----|---|---------|----------------|---------|
| 6,867,368 | B2 | * | 3/2005  | Kumar et al.   | 174/524 |
| 7,210,859 | B2 | * | 5/2007  | Kumar et al.   | 385/88  |
| 7,284,915 | B2 | * | 10/2007 | Healy et al.   | 385/92  |
| 7,476,040 | B2 | * | 1/2009  | Zack et al.    | 385/93  |
| 2004/0163836 | A1 | * | 8/2004 | Kumar et al.  | 174/50  |
| 2005/0089280 | A1 | * | 4/2005 | Kumar et al.  | 385/88  |
| 2006/0045436 | A1 | * | 3/2006 | Wang et al.   | 385/92  |
| 2009/0175582 | A1 | * | 7/2009 | Togami et al. | 385/92  |

* cited by examiner

*Primary Examiner* — K. Cyrus Kianni
(74) *Attorney, Agent, or Firm* — Maschoff Gilmore & Israelsen

(57) ABSTRACT

In one example embodiment, an optoelectronic module comprises a body, a signal ground, and an OSA. The body is connected to chassis ground and defines a cavity within which one or more components are disposed. The optical subassembly is disposed in the body cavity, has one or more components connected to signal ground, and comprises a header assembly, a housing, and one or more containment structures. The header assembly houses one or more components that generate EMI emissions and includes an optical aperture. The housing includes a port and a barrel. The port defines a fiber receptacle and the barrel defines a cavity that at least partially receives the header assembly. The containment structure(s) at least partially contain the EMI emissions within the OSA.

14 Claims, 6 Drawing Sheets

ELECTROMAGNETIC INTERFERENCE CONTAINMENT STRUCTURES

CROSS-REFERENCE TO RELATED APPLICATIONS

The present application is a divisional of U.S. patent application Ser. No. 12/348,767, filed on Jan. 5, 2009, now U.S. Pat. No. 7,837,399 which claims the benefit of priority to U.S. Provisional Application Ser. No. 61/019,168, entitled "METAL MASKING OF OPTICAL SUB ASSEMBLY OF A PORT OF AN OPTICAL MODULE," filed Jan. 4, 2008; U.S. Provisional Application Ser. No. 61/019,170, entitled "ATTACHMENT OF OPTICAL TRANSCEIVER MODULE COMPONENTS USING CONDUCTIVE EPOXY MATERIAL," filed Jan. 4, 2008; U.S. Provisional Application Ser. No. 61/019,173, entitled "PORT SHIELD DEVICES FOR ELECTROMAGNETIC INTERFERENCE CONTAINMENT," filed Jan. 4, 2008; and U.S. Provisional Application Ser. No. 61/019,177, entitled "OPTICAL HEADER ASSEMBLIES WITH APERTURES ADAPTED FOR ELECTROMAGNETIC INTERFERENCE CONTAINMENT," filed Jan. 4, 2008. The foregoing applications are fully incorporated herein by reference in their entirety.

BACKGROUND OF THE INVENTION

1. The Field of the Invention

The present invention relates generally to the control and reduction of electromagnetic interference ("EMI"). More particularly, some example embodiments relate to EMI containment structures that can be employed to at least partially contain EMI generated by optical subassembly ("OSA") components within the OSA.

2. The Relevant Technology

Computing and networking technology have transformed our world. As the amount of information communicated over networks steadily increases, high speed transmission becomes ever more critical. Many high speed data transmission networks rely on optical transceivers and similar devices for facilitating transmission and reception of digital data embodied in the form of optical signals over optical fibers. Optical networks are thus found in a wide variety of high speed applications ranging from modest Local Area Networks ("LANs") to backbones that define a large portion of the infrastructure of the Internet.

Typically, data transmission in such networks is implemented by way of an optical transmitter (also referred to as an "electro-optic transducer"), such as a laser or Light Emitting Diode ("LED"). The optical transmitter emits light when current is passed through it, the intensity of the emitted light being a function of the magnitude of the current. Data reception is generally implemented by way of an optical receiver (also referred to as an opto-electric transducer), an example of which is a photodiode. The optical receiver receives light and generates a current, the magnitude of the generated current being a function of the intensity of the received light.

Various other components are also employed by the optical transceiver to aid in the control of the optical transmit and receive components, as well as the processing of various data and other signals. For example, the optical transmitter is typically housed in a transmitter optical subassembly ("TOSA"), while the optical receiver is housed in a separate receiver optical subassembly ("ROSA"). The transceiver also typically includes a driver (e.g., referred to as a "laser driver" when used to drive a laser signal) configured to control the operation of the optical transmitter in response to various control inputs and an amplifier (e.g., often referred to as a "post-amplifier") configured to amplify the received signal prior to further processing. A controller circuit or controller controls the operation of the laser driver and post-amplifier.

One common difficulty associated with transceiver modules is the generation of EMI. The generation of EMI by a module is a matter of concern because such EMI can seriously impair, if not prevent, the proper operation of other systems and devices in the vicinity. In recognition of the problems presented by EMI generation, various attempts have been made to control and/or contain EMI. Many such attempts have focused on the development of various types of structures intended to contain, to the extent practicable, the signals and/or structure that generate EMI. However, the problems and deficiencies inherent in such attempts have become increasingly problematic as data rates and corresponding operational frequencies increase.

For example, some attempts at EMI control have focused on the use of stamped sheet metal parts bent or folded to define a Faraday cage for the control of EMI. However, an inherent limitation of such approaches is that mechanical reliefs, such as holes or punchouts, are provided in order to enable the bending of the metal into the desired shape or to provide some type of connection between the components inside the faraday cage and components outside of the cage. Unfortunately, such holes or punchouts provide an escape path for EMI.

Further, many devices such as transceivers and transponders are 'pluggable.' Pluggable devices, for example, may include an edge connector that can be removably plugged into a corresponding connector of another device, such as a host board. Such host boards often include some type of EMI control cage structure within which the device is positioned when it has been plugged into the host board. However, typical cages and similar structures are problematic because they generally fail to completely and reliably enclose the portions of the pluggable device, such as the edge connector for example. This then becomes one area where EMI can escape.

This problem is further complicated by the fact that components such as optical transceivers typically interface with optical fibers using ports. Optical signals are transmitted through and received from optical fibers via the ports. Unfortunately, these ports provide a path through which EMI can escape. This is true even when the ports are connected with optical fibers in conventional devices.

The subject matter claimed herein is not limited to embodiments that solve any disadvantages or that operate only in environments such as those described above. Rather, this background is only provided to illustrate one exemplary technology area where some embodiments described herein may be practiced

BRIEF SUMMARY OF SOME EXAMPLE EMBODIMENTS

In general, example embodiments relate to OSAs and optoelectronic modules that include one or more EMI containment structures configured to at least partially contain, within the OSA, EMI generated by OSA components.

In one example embodiment, an optoelectronic module comprises a body, a signal ground, and an OSA. The body is connected to chassis ground and defines a cavity within which one or more components are disposed. The optical subassembly is disposed in the body cavity, has one or more components connected to signal ground, and comprises a header assembly, a housing, and one or more containment structures. The header assembly houses one or more components that generate EMI emissions and includes an optical aperture. The housing includes a port and a barrel. The port defines a fiber receptacle and the barrel defines a cavity that at least partially receives the header assembly. The containment structure(s) at least partially contains the EMI emissions within the OSA.

In another example embodiment, an OSA comprises a header assembly, a housing, and one or more containment structures. The header assembly has one or more components configured to be connected to signal ground. The header assembly includes one or more components housed within the header assembly that generate EMI emissions and an optical aperture formed in the header assembly through which optical signals can be transmitted. The housing is configured to be connected to chassis ground and includes a port and a barrel. The port defines a fiber receptacle and the barrel defines a cavity that at least partially receives the header assembly. The containment structure(s) at least partially contains the EMI emissions within the OSA.

Additional features and advantages of the invention will be set forth in the description which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION

Figure 1A:
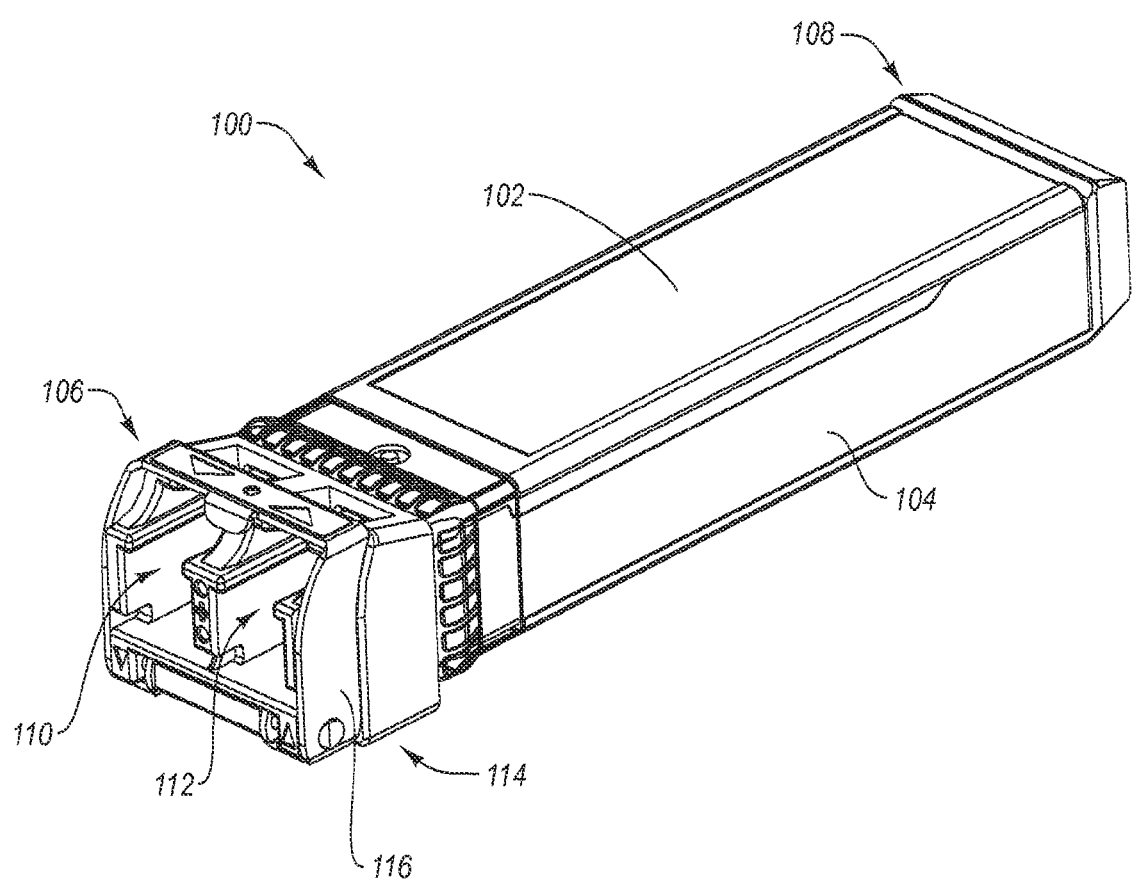
FIGS. 1A and 1B disclose an example embodiment of an optoelectronic module incorporating a TOSA and a ROSA.

Embodiments of the invention relate to the reduction and containment of EMI. Embodiments of the invention are described in the context of an optoelectronic device or module such as an optical transceiver or an optical transponder. These devices can include components that generate electromagnetic radiation that can result in unwanted EMI. Devices such as optical transceivers are typically designed to contain EMI emissions, using, by way of example, a faraday cage. In some instances, however, there may be various areas in optical transceivers and similar devices where the Faraday cage or other transceiver EMI control structures may be unable to effectively contain EMI emissions.

An optical transceiver, for example, typically interfaces with optical fibers via a pair of optical ports. Each optical port can include an opening in the EMI control structure to allow the transmission or reception of optical signals through the port. In some cases, the openings in the EMI control structure may be sufficiently large to allow EMI emissions to escape from the optical transceiver. As such, conventional ports may not block EMI emissions because of the need to receive and transmit optical signals. Thus, the reception and transmission of optical signals can be associated with one or more openings in the EMI control structure through which EMI may be emitted.

Example embodiments of the invention include OSAs, such as TOSAs and/or ROSAs, which can be implemented in optoelectronic devices to reduce the EMI that escapes through the optical ports of the optoelectronic devices. The OSAs can include one or more containment structures, such as a metallization layer on the OSA housing, an EMI containment disk, an EMI port shield, and/or an EMI containment layer on a header assembly window of the OSA. The one or more containment structures can comprise metal or other suitable material(s) that are configured to at least partially contain EMI emissions.

Briefly, example EMI containment structures include metalized OSA housings where both the OSA housing exterior surface and a portion of the OSA housing interior surface are metalized with a metallization layer. As will be explained below, an interior radial surface of the barrel of the OSA can be metalized in some examples. In contrast, an integral lens disposed within the barrel of the OSA must not be metalized in some examples. With the interior radial surface of the barrel of the OSA housing metalized, the gap through which EMI can escape from the OSA can be reduced and EMI emissions can consequently be reduced.

Alternately or additionally, EMI containment structures can include an EMI containment disk that is attached to an OSA header assembly with a conductive epoxy. In some embodiments, a trans-impedance amplifier ("TIA") or other component within the OSA header assembly can be a generator of EMI. Some OSA header assemblies can have a window optical aperture of approximately 2.5 mm, which can allow EMI to escape at higher data rates. However, an EMI containment disk having an aperture that is smaller than the window optical aperture can be connected to the header assembly using, for example, a conductive epoxy. The EMI containment disk could then provide a ground path to signal ground in some embodiments and operate to at least partially contain EMI within the header assembly and/or the OSA.

Alternately or additionally, EMI containment structures can include an EMI port shield that is inserted into a metalized plastic OSA housing with conductive epoxy or mechanical interference. An EMI port shield can reduce the effective size of the window optical aperture without affecting the lens performance. By electrically connecting the EMI port shield to the metalized plastic OSA housing, the EMI port shield can be electrically connected to chassis ground and operate to at least partially contain EMI that escapes from the header assembly within the OSA.

Alternately or additionally, EMI containment structures can include an EMI containment layer that is applied directly to the header assembly window. The header assembly window EMI containment layer can comprise a metal coating or other material(s) that defines a window optical aperture having a sufficiently small diameter to at least partially contain EMI within the header assembly. The header assembly window EMI containment layer can be electrically connected to signal ground and can operate to at least partially contain EMI within the header assembly.

I. Example Operating Environment

Reference will now be made to figures where examples of the invention are disclosed. It is understood that the drawings are diagrammatic and schematic representations of example embodiments of the invention, and are not limiting of the present invention nor are they necessarily drawn to scale.

FIGS. 1A-3 depict various features of some example embodiments of the present invention, which are generally directed to optoelectronic modules that include an interior configuration designed to at least partially contain electromagnetic interference ("EMI") produced by the optoelectronic module during operation. Containment of EMI in this manner can result in improved operation of the optoelectronic module and improved integrity of data signals carried by the optoelectronic module. Alternately or additionally, containment of EMI in this manner can limit the adverse impact of the optoelectronic module on its environment.

Reference is first made to FIG. 1A, which illustrates an example embodiment of an optoelectronic module, generally designated as transceiver 100 in this example. The transceiver 100 may comprise an SFP+ optical transceiver, although this is not required in all embodiments. While described in some detail herein, the optical transceiver 100 is discussed by way of illustration only, and not by way of restricting the scope of the invention. For example, although the transceiver 100 can comprise an SFP+ optical transceiver in some embodiments, the principles of the invention can be implemented in optoelectronic modules of any form factor, such as XFP, SFP, SFP+, SFF, XENPAK and XPAK, without restriction. Alternately or additionally, the transceiver 100 can be suitable for optical signal transmission and reception at a variety of per-second data rates, including but not limited to 1 Gbit, 2 Gbit, 4 Gbit, 8 Gbit, 10 Gbit, 20 Gbit or higher bandwidth fiber optic links. Furthermore, optoelectronic modules of other types and configurations, or having components that differ in some respects from those shown and described herein, can also benefit from the principles disclosed herein.

As shown in FIG. 1A, the transceiver 100 includes a body composed of a top shell 102 and bottom shell 104. One or both of the top shell 102 and bottom shell 104 can comprise or can be connected to chassis ground. The bottom shell 104 defines a front end 106 and a back end 108 of the transceiver 100. Included on the front end 106 of the transceiver 100 bottom shell 104 are two optical ports 110, 112 configured to receive connectors of an optical fiber. The two optical ports 110, 112 include an output port 110 and an input port 112. The optical ports 110, 112 define a portion of an interface portion 114 that is generally included on the front end 106 of the transceiver 100. The interface portion 114 can include structures to operably connect the transceiver 100 to optical fibers or optical fiber connectors such as LC connectors.

Also disposed on the transceiver 100 front end 106 is a bail latch assembly 116 that enables the transceiver 100 to be removably secured in a host device (not shown). The body of the transceiver 100, including top shell 102 and bottom shell 104, can be formed of metal and may be designed to contain EMI that is generated inside of the body by the components of the transceiver 100. Alternately or additionally, the host device may include a cage in which the transceiver 100 is inserted. The cage may provide EMI containment by itself or in conjunction with the body of the transceiver 100.

Figure 1B:
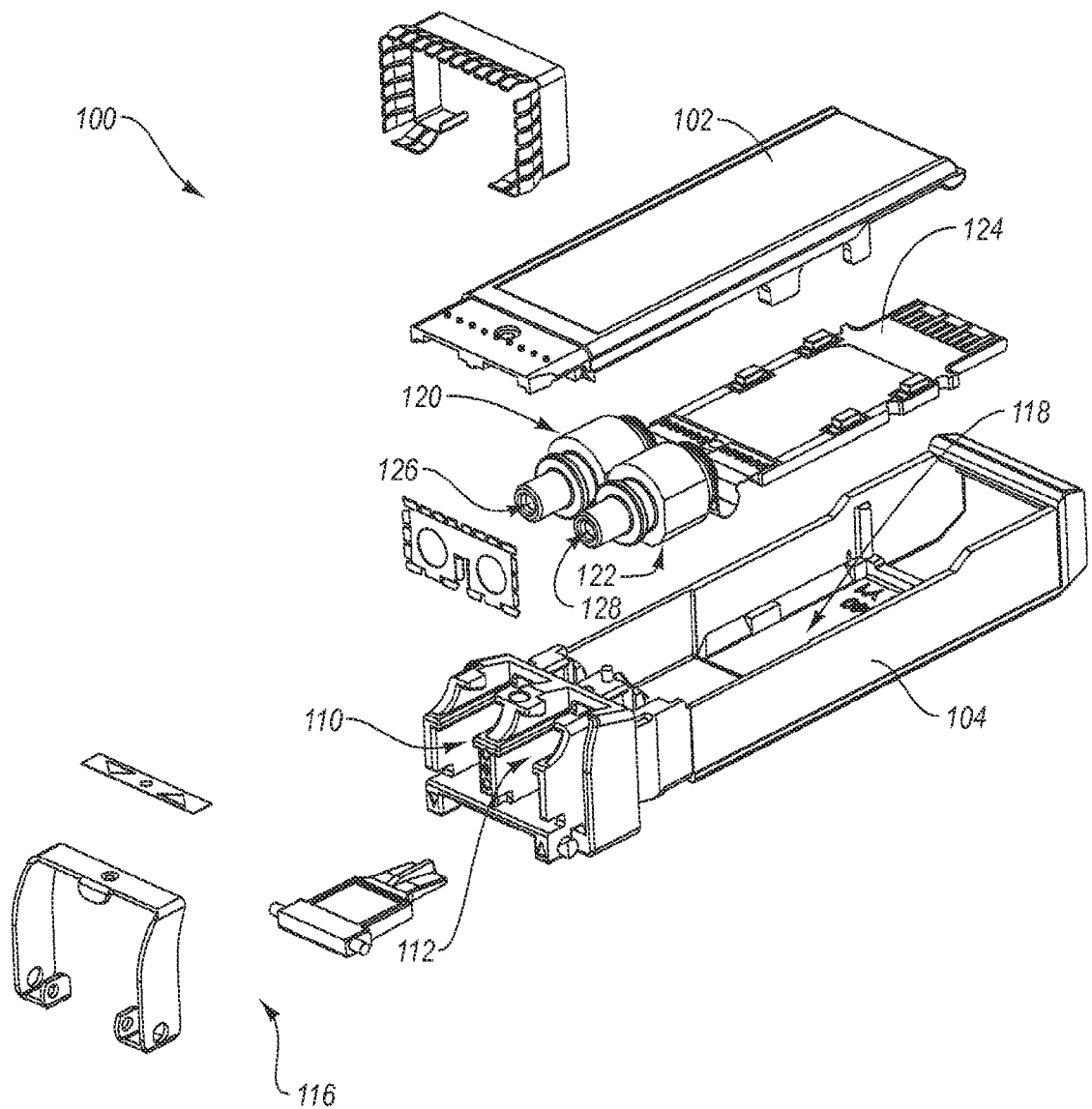

Turning now to FIG. 1B, an exploded view of the transceiver 100 of FIG. 1A is provided. As illustrated in FIG. 1B, the bottom shell 104 defines a cavity 118 in which a TOSA 120, a ROSA 122, and printed circuit board ("PCB") 124 are included as internal components of the transceiver 100. One or more of the TOSA 120, the ROSA 122, or the components disposed on the PCB 124 may participate in the generation of electromagnetic signals that result in EMI.

Each of the TOSA 120 and ROSA 122 includes a port 126 and 128, respectively, that extends into a respective one of the optical ports 110, 112 so as to be positioned to mate with an optical fiber (not shown) or a connector portion (not shown) of the optical fiber when received within optical ports 110, 112. When fully assembled within transceiver 100, both TOSA 120 and ROSA 124 may be electrically connected to the bottom shell 104 and therefore both can be electrically connected to chassis ground. The chassis ground can be connected to the shell or body of the transceiver 100 and/or to the host device as well. In some embodiments, it can be useful to provide a connection to chassis ground as chassis ground can also be used in the control and/or containment of EMI.

In some embodiments, the circuitry and components that generate or receive optical signals may be isolated from chassis ground inside of the TOSA 120 or ROSA 122. Instead, the circuitry and components within the TOSA 120 and ROSA 122 that generate and receive optical signals may be connected to a signal ground of the transceiver 100. Alternately or additionally, the circuitry and components that generate and receive optical signals can be connected to chassis ground.

During operation, the transceiver 100 can receive a data-carrying electrical signal from a host device, which can be any computing system capable of communicating with the optical transceiver 100, for transmission as a data-carrying optical signal on to an optical fiber (not shown). The electrical signal can be provided to an optical transmitter, such as a laser disposed within the TOSA 120, which converts the electrical signal into a data-carrying optical signal for emission on to an optical fiber and transmission via an optical communications network, for instance. The optical transmitter can comprise an edge-emitting laser diode, a Fabry-Perot ("FP") laser, a vertical cavity surface emitting laser ("VCSEL"), a distributed feedback ("DFB") laser, or other suitable light source. Accordingly, the TOSA 120 can serve or include components that serve as an electro-optic transducer.

In addition, the transceiver 100 can receive a data-carrying optical signal from an optical fiber via the ROSA 122. The ROSA 122 can include an optical receiver, such as a photodiode or other suitable receiver, which transforms the received optical signal into a data-carrying electrical signal. Accordingly, the ROSA 122 can serve or include components that serve as an opto-electric transducer. The resulting electrical signal can then be provided to the host device in which the transceiver 100 is located.

II. Example Optical Subassembly

Figure 2A:
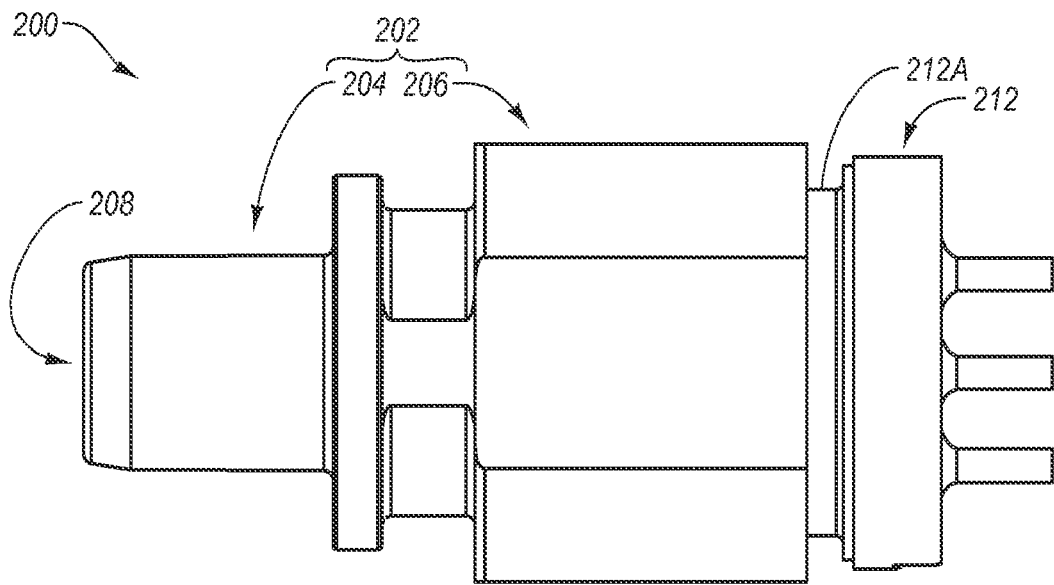
FIGS. 2A-2E disclose an example OSA that may correspond to one or both of the TOSA and ROSA of FIGS. 1A and 1B and that employs one or more EMI containment structures according to embodiments of the invention.

Embodiments of the invention include one or more EMI containment structures that can be included in the TOSA 120 and/or the ROSA 122, as will be explained in greater detail below with respect to FIGS. 2A-3. FIGS. 2A-2E disclose an example OSA 200 and FIG. 3 discloses an example header assembly 300 that can be included in the OSA 200. Whereas the design of both the TOSA 120 and the ROSA 122 of FIGS. 1A and 1B can be similar, at least with respect to the components that interface with optical fibers or that house the electronic and optical components of the TOSA 120 and ROSA 122, the OSA 200 may correspond to one or both of the TOSA 120 or ROSA 122 of FIGS. 1A and 1B. Thus, the principles of embodiments of the invention described herein can be generally applied to both the TOSA 120 and the ROSA 122 of FIGS. 1A and 1B and/or to connectors on optical fibers.

Figure 2B:
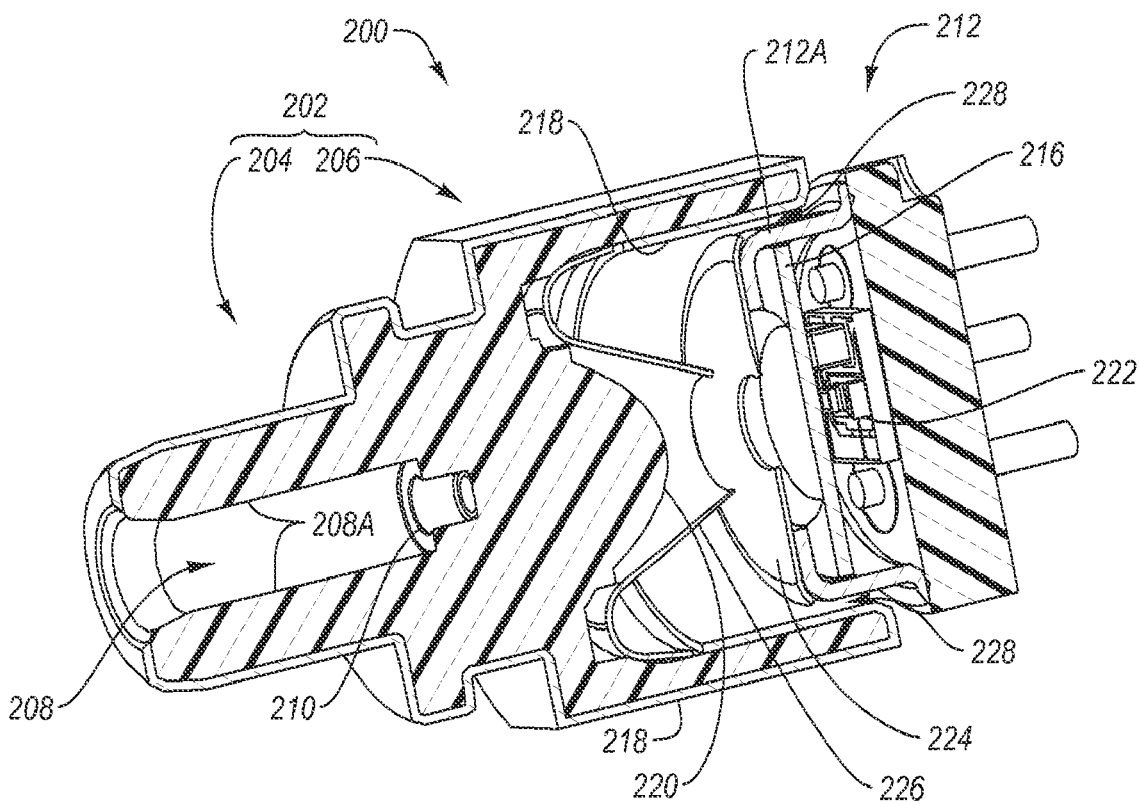
Figure 2C:
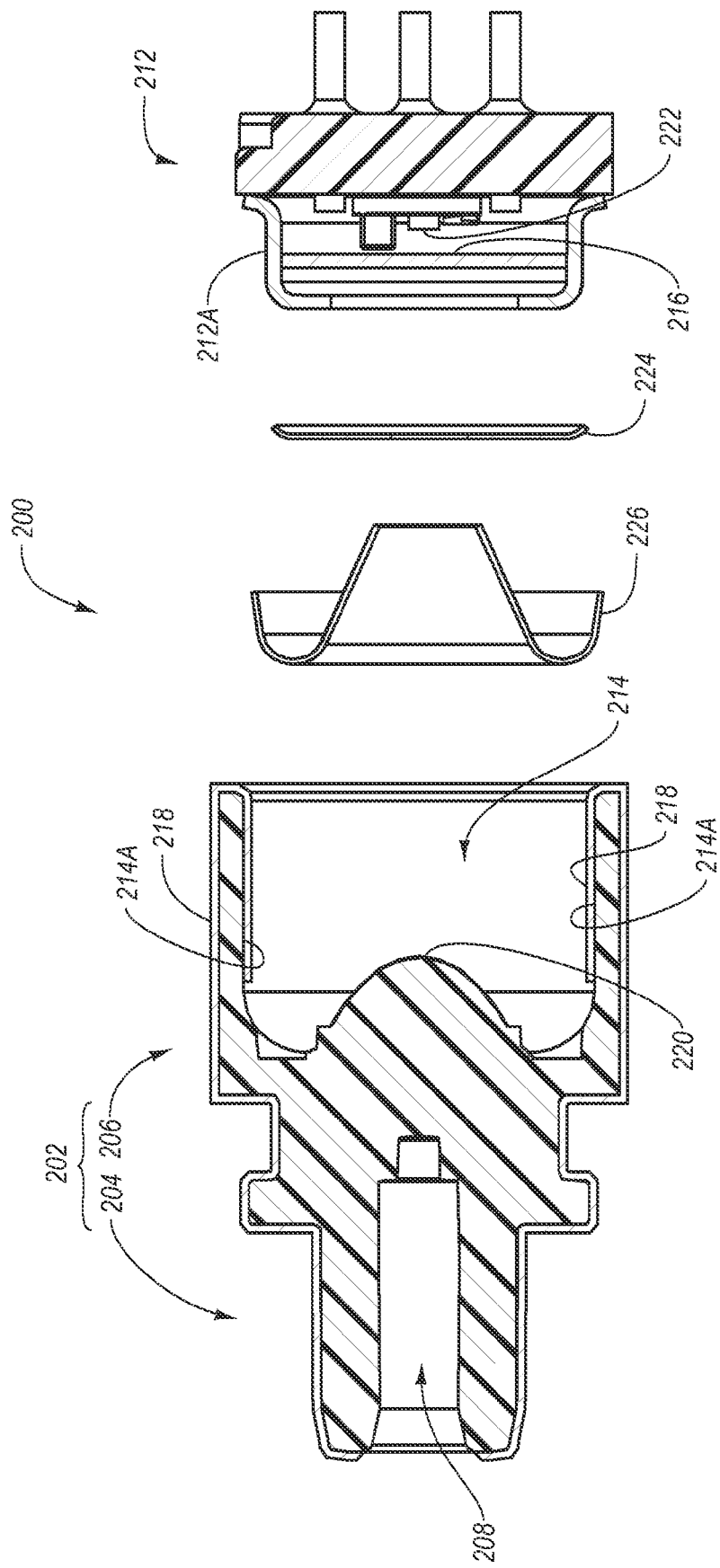
Figure 2D:
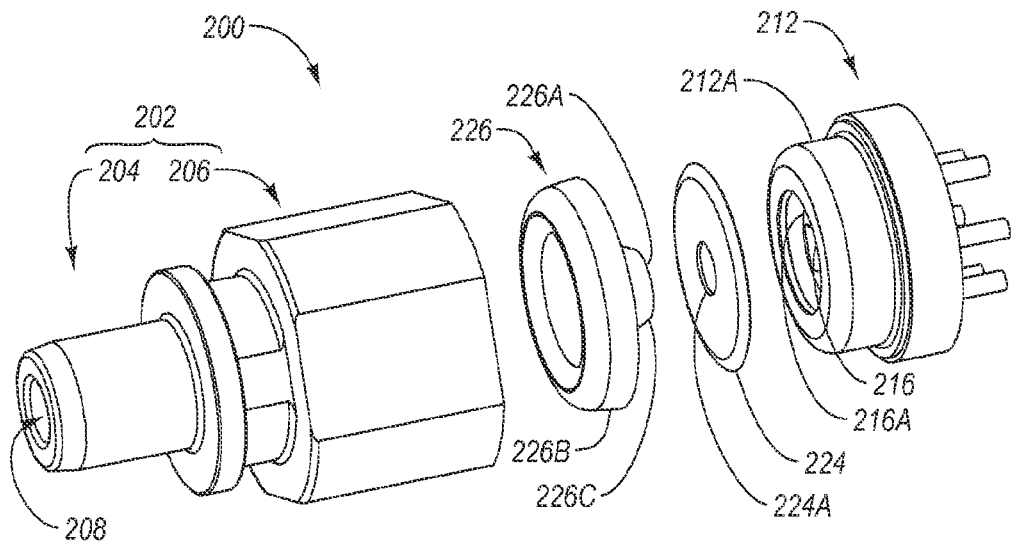
Figure 2E:
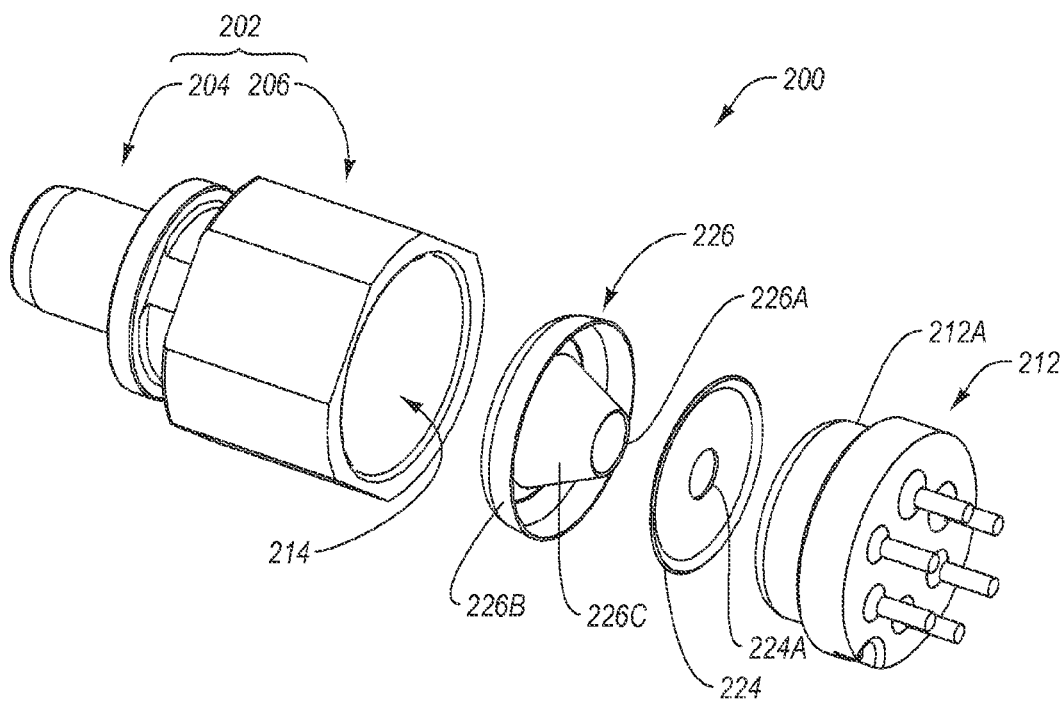

Reference is now made to FIGS. 2A-2F which disclose various aspects of the OSA 200. FIG. 2A illustrates a side view of the OSA 200. FIG. 2B illustrates a cross-sectional perspective view of the OSA 200. FIG. 2C illustrates a cross-sectional exploded side view of the OSA 200. FIGS. 2D and 2E illustrate exploded perspective views of the OSA 200 from different perspectives.

In this example, the OSA 200 can include a housing 202 comprising a port 204 and a barrel 206. One end of the housing 202, e.g., the port 204, provides a fiber interface while the other end of the housing 202, e.g., the barrel 206, provides a header assembly interface. The port 204 defines a fiber receptacle 208 configured to receive an optical fiber. A fiber stop 210 (FIG. 2B) located at the end of fiber receptacle 208 serves to limit the distance to which the received optical fiber can be inserted into the port 204 of OSA 200.

The barrel 206 is configured to at least partially receive a header assembly 212 within a barrel cavity 214 (FIG. 2C) defined by the barrel 206. The header assembly 212 may comprise a TO can, for example, or other type of header assembly according to a determined form factor. The header assembly 212 houses some of the electrical components and optical components employed to generate an optical signal from an electrical signal in the case of a TOSA, and some of the electrical components and optical components employed to generate an electrical signal from an optical signal in the case of a ROSA. One or more of the electrical components and/or optical components can generate EMI emissions.

The header assembly 212 can include a window 216 (FIGS. 2B-2D) through which optical signals can be transmitted.

The header assembly 212 can include a header assembly housing 212A formed of metal. The header assembly housing 212A may be insulated from electrical signals internal to the header assembly 212. In some embodiments, the header assembly housing 212A is connected to a signal ground associated with the electrical signals, while in other embodiments the header assembly housing 212A is not connected to signal ground.

In some embodiments, the OSA 200 housing 202 can be implemented as a single element. For instance, the housing 202 may be formed of or molded from plastic. Generally speaking, header assemblies can include components that generate electromagnetic radiation that may result in EMI. This EMI can escape from the header assembly through the window of the header assembly. Thus, in some instances, a plastic OSA housing by itself may be ineffective in containing EMI emitted by components within the header assembly 212.

However, embodiments of the invention relate to EMI containment structures that can reduce and/or at least partially contain EMI emissions within OSA 200, including EMI emitted by components within header assembly 212. Example EMI containment structures include housing 202 metallization layers, EMI containment disks, EMI port shields, and EMI containment layers on header assembly windows 216. Each of these EMI containment structures will be described below.

A. OSA Housing Metallization Layer

In some embodiments, selected surfaces of the housing 202 can be metalized by applying a metallization layer to the selected surfaces. The metallization of these selected surfaces of the housing 202 can reduce the size of the aperture through which EMI may escape from the OSA 200 and can allow the EMI opening in the body of a transceiver, e.g., transceiver 100, to be effectively closed more than when using non-metalized OSA housings. The metallization layer can thereby reduce and/or at least partially contain EMI emissions within the OSA 200.

One example of a metallization layer 218 is best seen in FIGS. 2B and 2C. As shown in FIGS. 2B and 2C, the metallization layer 218 can substantially cover the exterior surface of the plastic housing 202 and can extend partially into and cover at least a portion of the interior surface 214A of the housing 202 barrel cavity 214. For example, in some embodiments, the metallization layer 218 covers an interior radial surface of the barrel cavity 214.

With combined reference to FIGS. 1A and 2C, the metallization layer 218 of the housing 202 can be grounded to chassis ground via, for example, bottom shell 104, by contacting the bottom shell 104 when the OSA 200 is inserted into the bottom shell 104. By grounding the metallization layer 218 to chassis ground, the metallization layer 218 can minimize EMI emitted from elements within the housing 202.

In some embodiments, an interior surface 208A (FIG. 2B) of fiber receptacle 208 may not be metalized, as fiber receptacle 208 accommodates an optical fiber. Embodiments of the invention, however, contemplate situations where the interior surface 208A may be metalized.

An interior surface 214A of the barrel cavity 214 can be metalized as desired. For instance, the interior radial surface of the barrel cavity 214 can be metalized. Alternately or additionally, the plastic housing 202 can include an integral lens 220 (FIGS. 2B-2C) that can be masked off during the metallization process to avoid metalizing the integral lens 220. It may be desirable to mask off the integral lens 220 as metallization of the entire interior surface 214A of the barrel 206 cavity 214 including the integral lens 220 may prevent the integral lens 220 from operating properly and may prevent optical signals from passing through the integral lens 220.

The housing 202 of the TOSA 200 is further configured to engage header assembly 212, receiving at least a portion of the header assembly 212 within barrel cavity 214. As already mentioned, the header assembly 212 can be implemented as a TO can and can include a header assembly window 216. The header assembly window 216 may comprise a transparent lens that allows optical signals to pass therethrough. Alternately or additionally, the header assembly window 216 can be transmissive to EMI emissions generated within the header assembly 212.

An active optical component 222 (FIGS. 2B-2C) can be hermetically sealed within the header assembly 212. The active optical component 222 may comprise an optical transmitter in the case of a TOSA, or an optical receiver in the case of a ROSA. The active optical component 222 can be positioned within the header assembly 212 so as to be aligned with an optical aperture 216A (FIG. 2D) of the header assembly window 216 to allow the active optical component 212 to transmit, or receive, optical signals through the optical aperture 216A of header assembly window 216.

As used herein, the optical aperture 216A of header assembly window 216 refers to the portion of the header assembly window 216 through which optical signals can pass. The optical aperture 216A can be defined by, for example, the opening formed in the header assembly housing 212A, the opening formed in an EMI containment layer deposited on the header assembly window 216, or the like or any combination thereof.

In some embodiments, the OSA 200 comprises a TOSA, in which case the active optical component 222 can be an optical transmitter comprising a laser, examples of which include, but are not limited to, edge-emitting laser diodes, FP lasers, VCSELs and DFB lasers. In this example, the optical transmitter active optical component 222 employed in the OSA 200 may be selected to generate optical signals at a particular desired wavelength.

B. EMI Containment Disk

In operation, the active optical component 222 can comprise an optical transmitter, and when an electrical signal is received by OSA 200, the electrical signal is converted to an optical signal which is then emitted from the optical transmitter. The optical signal travels from optical transmitter through the header assembly window 216 of the header assembly 212. The process of generating the optical signal can be associated with the production of EMI.

Alternately, the active optical component 222 can comprise an optical receiver, and the OSA 200 can receive an optical signal which travels into header assembly 212 through header assembly window 216, where the optical signal is incident upon the optical receiver. The optical signal can then be converted to an electrical signal by the optical receiver. The process of generating the electrical signal from the optical signal can be associated with the production of EMI.

In some examples, the optical aperture 216A of header assembly window 216 may have a diameter that allows excessive emission of EMI produced during the generation of optical or electrical signals by the active optical component 222. Accordingly, some embodiments of an EMI containment structure include an EMI containment disk 224 (FIGS. 2B-2E) disposed between the header assembly 212 and the integral lens 220. The EMI containment disk 224 can be disposed inside of the barrel cavity 214 during or after manufacture of the OSA 200.

The EMI containment disk 224 may be made of any material suitable for reducing or preventing the emission of EMI, or that is otherwise suitable for containing EMI emissions. For instance, EMI containment disk 224 may comprise an EMI blocking material such as stainless steel or other metal. Alternately or additionally, EMI containment disk 224 may comprise an EMI absorbing material. Alternately or additionally EMI containment disk 224 can be attached to header assembly 212 using a conductive epoxy, examples of which include silver epoxy, such that the EMI containment disk 224 is electrically connected to signal ground via the header assembly 212.

As disclosed in FIG. 2D, the diameter of EMI containment disk aperture 224A can be smaller than the diameter of the optical aperture 216A of header assembly window 216. The reduced size of the diameter of the EMI containment disk aperture 224A compared to the diameter of the optical aperture 216A of header assembly window 216 allows the EMI containment disk 224 to at least partially contain some or all of the EMI that escapes through the optical aperture 216A of header assembly window 216 by blocking or absorbing some or all of the EMI.

In this and other embodiments, the EMI containment disk aperture 224A can be substantially aligned with the optical aperture 216A of header assembly window 216.

Although not shown, in some embodiments, the EMI containment disk 224 may be disposed within the header assembly 212. Inclusion of the EMI containment disk 224 within the header assembly 212 can effectively reduce the size of the optical aperture 216A of header assembly window 216 from which EMI may escape.

The EMI containment disk 224 can be implemented alone or in combination with a housing 202 that includes metallization layer 218, for example. When implemented in combination with housing 202 that includes metallization layer 218, the EMI containment disk 224 can be disposed such that it does not connect to metallization layer 218. Alternately or additionally, the EMI containment disk 224 can be connected to signal ground of the header assembly 212.

C. EMI Port Shield

Alternately or additionally, embodiments of the invention can include an EMI port shield 226 (FIGS. 2B-2E) interposed between the plastic housing 202 and the header assembly 212 within barrel cavity 214. The EMI port shield 226 may be attached to the metallization layer 218 of the plastic housing 202 with conductive epoxy or mechanical interference such that it is grounded to the chassis via the metallization layer 218 applied to the interior surface of the barrel cavity 214.

In some embodiments, the diameter of EMI port shield aperture 226A (FIGS. 2D-2E) can be smaller than the diameter of the optical aperture 216A of header assembly window 216. When the diameter of the EMI port shield aperture 226A is smaller than the diameter of the optical aperture 216A, the EMI port shield 226 can reduce the effective size of the aperture through which EMI can escape from the OSA 200, thereby reducing EMI emission without otherwise affecting the performance of integral lens 220 or of OSA 200.

In some embodiments, the EMI port shield 226 has a conical or funnel shape that includes a grounding surface 226B at a wide end of the funnel shape and an aperture surface 226C at a narrow end of the funnel shape. The grounding surface 226B may be configured to allow the EMI port shield 226 to make contact with the metallization layer 218 and connect to chassis ground. The EMI port shield 226 can have a mechanical or pressure fit, for example, that ensures that the EMI port shield 226 is connected to the chassis ground via the metallization layer 218, which can be connected to the body of a transceiver as previously described.

The aperture surface 226C can taper inward like a cone or funnel to form an EMI port shield aperture 226A that is sufficiently large to allow operation of the OSA 200 while being sufficiently small to block and/or absorb some or all of the EMI transmitted through the optical aperture 216A of header assembly window 216. Thus, the EMI port shield aperture 226A can effectively reduce the size of the opening through which EMI can escape from the OSA 200.

The size of the EMI port shield aperture 226A can be selected according to a particular design. Alternately or additionally, the shape of the EMI port shield 226 may be adapted to the shape of the receptacle in which it will be implemented. For instance, the shape of the EMI port shield 226 can be adapted for the barrel cavity 214 defined in the housing 202 for receiving the header assembly 212. In some embodiments, the EMI port shield 226 defines a funnel shape forming the EMI port shield aperture 226A.

In this and other embodiments, the EMI port shield aperture 226A can be substantially aligned with the optical aperture 216A of header assembly window 216.

The EMI containment disk 224, the EMI port shield 226, and the metallization layer 218 of the housing 202 are configured and employed in the OSA 200 to at least partially contain EMI signals produced by the OSA 200 or by other components of a transceiver, transponder, or other optoelectronic module in which the OSA 200 is implemented. By containing, controlling, or shielding these EMI signals, the EMI containment disk 224, the EMI port shield 226 and the metallization layer 218 of the housing 202 reduce overall EMI emission from the optoelectronic module in which the OSA 200 is implemented.

With respect now to FIG. 2B, an example path followed by an optical signal through the OSA 200 will be described in the case where the active optical component 222 comprises an optical transmitter. In this example, the active optical component 222 emits an optical signal inside the header assembly 212. The active optical component 222 can be aligned with the optical aperture 216A of header assembly window 216 such that the emitted optical signal passes through header assembly window 216 and then through the EMI containment disk aperture 224A. In the present example, the EMI containment disk 224 can be mounted to the top of the header assembly 212 such that the outer edges of the EMI containment disk 224 can be in electrical contact with the housing of the header assembly 212. In this manner, the EMI containment disk 224 can be connected with signal ground of the header assembly 212.

The EMI containment disk 224 and header assembly 212 can be spatially separated from metallization layer 218 of housing 202 by a circumferential gap 228 such that the EMI containment disk 224 does not contact the metallization layer 218. The circumferential gap 228 can be filled with an insulating material, for example. Alternatively, the EMI containment disk 224 may contact the metallization layer 218 of the housing 202.

FIG. 2B further illustrates that, in some instances, the EMI port shield 226 may be spatially separated from the EMI containment disk 224 such that the EMI port shield 226 does not contact the EMI containment disk 224. Alternately, the EMI port shield 226 can contact the EMI containment disk 224.

After passing through the EMI containment disk aperture 224A, the optical signal then passes through the EMI port shield aperture 226A. As previously mentioned, the EMI port shield 226 can be inserted into the barrel cavity 214 of housing 202 such that the EMI port shield 226 is in electrical contact with the metallization layer 218, thereby connecting the EMI port shield 226 to chassis ground as previously described and thus providing EMI control or containment. The optical signal may then be focused by integral lens 220 into a fiber received in fiber receptacle 208. Alternately or additionally, one or more other optical lenses or other components can be disposed inside the barrel cavity 214 that process the emitted optical signal.

With continued reference to FIG. 2B, an example path followed by an optical signal through OSA 200 will be described in the case where the active optical component 222 comprises an optical receiver. In some embodiments, the optical signal path through an OSA 200 that includes an optical receiver may be substantially the reverse of the optical signal path through an OSA 200 that includes an optical transmitter. For example, the OSA 200 can include an optical fiber disposed in the fiber receptacle 208. An optical signal on the optical fiber may pass from the optical fiber through the integral lens 220, then through the EMI port shield aperture 226A, then through the EMI containment disk aperture 224A, then through the optical aperture 216A of header assembly window 216. After passing through the header assembly window 216, the optical signal can be incident upon the active optical component 222 comprising an optical receiver, whereupon the active optical component 222 converts the optical signal to an electrical signal.

With reference now to FIGS. 2D and 2E, some example shapes and configurations of some of the EMI containment structures (e.g., metallization layer 218, EMI containment disk 224, and EMI port shield 226) that can be employed in the OSA 200 are disclosed. Although not shown in FIGS. 2D and 2E, the housing 202 can include integral lens 220 that aids in focusing light from an active optical component 222 comprising an optical transmitter onto an optical fiber disposed in fiber receptacle 208. Alternately, integral lens 220 can aid in focusing light from an optical fiber disposed in fiber receptacle 208 onto an active optical component 222 comprising an optical receiver. In both examples, EMI containment disk aperture 224A and EMI port shield aperture 226A can be configured to allow the optical signals to pass unhindered while at least partially containing EMI within the OSA 200.

In some instances, depending on the location of the active optical component 222 inside of header assembly 212, the EMI containment disk 224 and/or EMI port shield 226 can have offset apertures 224A, 226A. Alternately or additionally, the EMI containment disk aperture 224A, EMI port shield aperture 226A, and/or optical transmitter 222 can be aligned during manufacture of the OSA 200.

D. Header Assembly Window EMI Containment Layer

Figure 3:
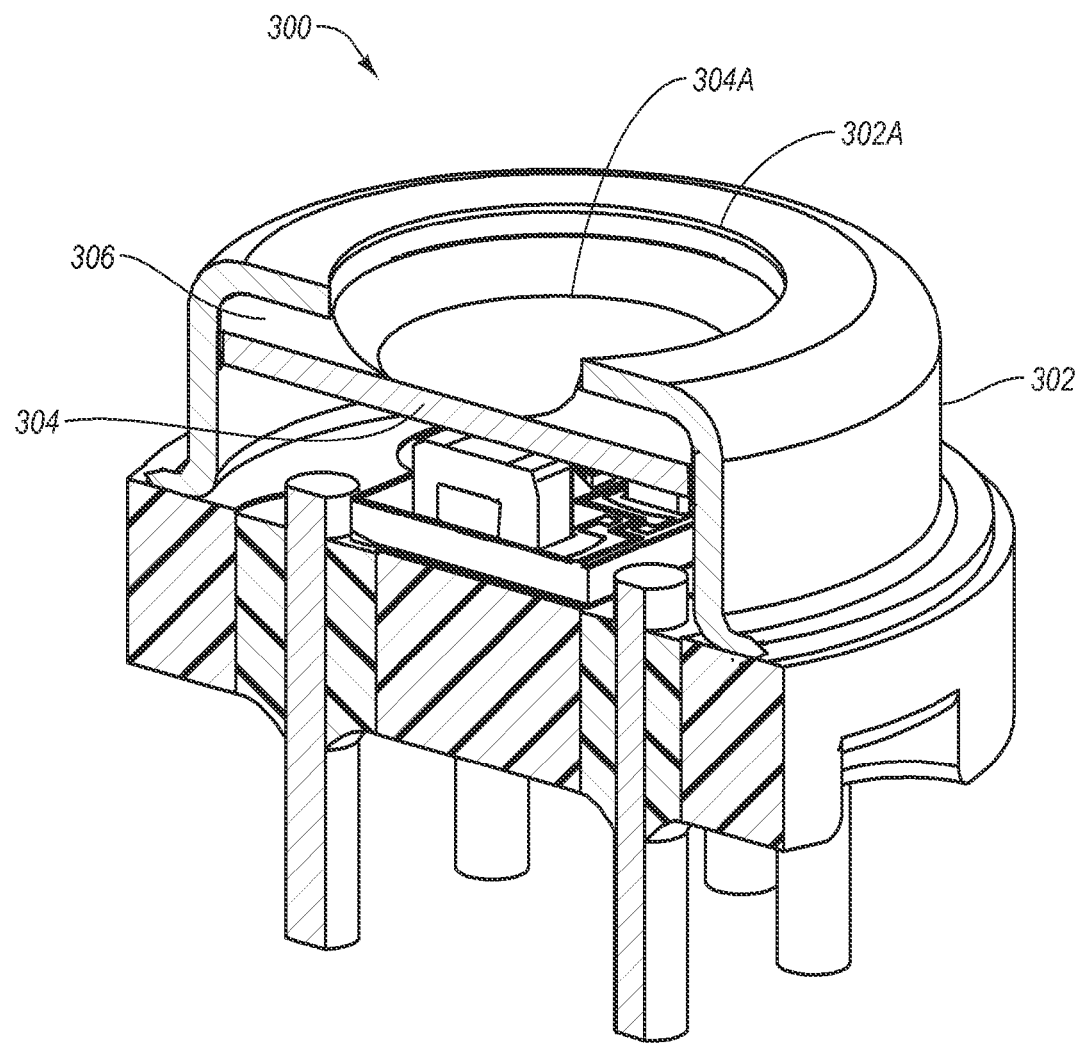
FIG. 3 is a cross-sectional perspective view of an example header assembly such as may be employed in the OSA of FIGS. 2A-2E.

Turning now to FIG. 3, a fourth example EMI containment structure will be described. FIG. 3 illustrates a cross-sectional perspective view of a header assembly 300 that may correspond to the header assembly 212 of FIGS. 2A-2E. The header assembly 300 can comprise a TO can, or other header assembly having the same or a different form factor.

As shown in FIG. 3, the header assembly 300 includes a header assembly housing 302 and a header assembly window 304. Header assembly housing 302 may comprise metal, for example, and/or can be connected to signal ground. Header assembly window 304 may comprise a substantially optically transparent material that facilitates the transmission of optical signals into or out of the header assembly 300. As a result, in some cases the header assembly window 304 can also be substantially transparent to EMI.

However, header assembly 300 further includes an EMI containment layer 306 disposed on the header assembly window 304. The EMI containment layer 306 can comprise a metal coating, for example, or other suitable material(s), that is applied to the header assembly window 304 so as to define an optical aperture 304A on the header assembly window 304. The diameter of the optical aperture 304A formed by the EMI containment layer 306 can be smaller than the diameter of the aperture 302A formed in the header assembly housing 302. As a result, the amount of EMI that can escape through header assembly window 304 may be limited by the size of the optical aperture 304A, rather than by the size of the header assembly housing aperture 302A.

The size of the optical aperture 304A formed by the EMI containment layer 306 can be selected according to a particular design. For example, the maximum aperture to contain EMI generated by a 10 Gbit/s optical transmitter or receiver may be relatively smaller than the maximum aperture to contain EMI generated by a 1 Gbit/s optical transmitter or receiver. In some embodiments, after selecting a desired size for the optical aperture 304A, the header assembly window 304 can be masked to allow application of the EMI containment layer 306 to the header assembly window 304 except in the area of the optical aperture 304A.

Accordingly, EMI containment layer 306 can be formed on the header assembly window 304 to produce an optical aperture 304A that can reduce the EMI that escapes header assembly 300. In this and other examples, the EMI containment layer 306 may contact the metal of the header assembly 300 to provide a connection to a signal ground associated with the optical signal or the header assembly 300.

The examples disclosed above relate to various EMI containment structures, any one or more of which can be employed to provide EMI containment in, for instance, optical subassemblies ("OSAs"), including TOSAs and/or ROSAs. Alternately or additionally, the EMI containment structures can be employed in other environments. The EMI containment structures can include metallization layer 218, EMI containment disk 224, EMI port shield 226, and EMI containment layer 306. The EMI containment structures described herein can be used alone or in any combination. In some embodiments, the EMI containment structures can provide a conductive barrier or an EMI containment structure against EMI emitted by components within the OSA.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An optoelectronic module, comprising:
   a body defining a cavity within which one or more components are disposed, the body connected to chassis ground;
   a signal ground; and
   an optical subassembly disposed in the body cavity and having one or more components connected to the signal ground, the optical subassembly comprising:
      a header assembly within which one or more components that generate electromagnetic interference emissions are housed, the header assembly including an optical aperture;
      a housing including a port and a barrel, the port defining a fiber receptacle and the barrel defining a cavity that at least partially receives the header assembly;
      an integral lens disposed within the cavity defined by the barrel; and
      a containment structure, connected to signal ground and to the header assembly, that at least partially shields the electromagnetic interference emissions within the optical subassembly, the containment structure defining a containment aperture that is smaller than the optical aperture, wherein:
         the one or more containment structures further comprise a containment disk configured to be connected to the signal ground;
         the containment disk is disposed between the integral lens and the header assembly; and
         the containment disk defines a containment disk aperture that is smaller than the optical aperture.

2. The optoelectronic module of claim 1, wherein the containment structure further comprises a metallization layer substantially covering an exterior surface of the housing and a portion of an interior surface of the barrel.

3. The optoelectronic module of claim 2, wherein the metallization layer is connected to chassis ground.

4. The optoelectronic module of claim 2, wherein the metallization layer does not cover the integral lens.

5. The optoelectronic module of claim 1, wherein the containment disk defining the containment aperture that is substantially aligned with the optical aperture.

6. The optoelectronic module of claim 1, wherein a conductive epoxy attaches the containment disk to the header assembly and connects the containment disk to signal ground, and wherein the containment disk is not connected to the metallization layer.

7. The optoelectronic module of claim 6, wherein the conductive epoxy comprises silver epoxy.

8. The optoelectronic module of claim 2, wherein the containment structures further comprise a port shield disposed in the barrel cavity, the port shield defining a port shield aperture that is smaller than and substantially aligned with the optical aperture.

9. The optoelectronic module of claim 8, wherein the port shield has a funnel shape, including a wide end attached to a portion of the metallization layer within the barrel cavity and a narrow end defining the port shield aperture, het port shield being connected to chassis ground via the metallization layer.

10. The optoelectronic module of claim 9, wherein the wide end of the port shield is attached to the portion of the metallization layer by mechanical interference or conductive epoxy.

11. The optoelectronic module of claim 1, wherein the containment structure comprises a containment layer disposed on a window of the header assembly, the containment layer defining the optical aperture.

12. The optoelectronic module of claim 11, wherein the containment layer comprises a metal coating and is connected to signal ground.

13. An optoelectronic module, comprising:
   a body defining a cavity within which one or more components are disposed, the body connected to chassis ground;
   a signal ground; and
   an optical subassembly disposed in the body cavity and having one or more components connected to signal ground, the optical subassembly comprising:
      a header assembly within which one or more components that generate electromagnetic interference emissions are housed, the header assembly including an optical aperture;
      a housing including a port and a barrel, the port defining a fiber receptacle and the barrel defining a cavity that at least partially receives the header assembly;
      an integral lens disposed within the cavity defined by the barrel; and
      a containment structure, connected to a chassis ground, that at least partially shields the electromagnetic interference emissions within the optical subassembly, the containment structure defining a containment aperture that is smaller than the optical aperture, wherein:
         the containment structure comprises a metallization layer substantially covering an exterior surface of the house and an interior radial surface of the cavity, the metallization layer configured to be connected to chassis ground;
         the containment structure further comprises a port shield disposed between the integral lens and the header assembly, the port shield defining a port shield aperture that is smaller than and substantially aligned with the optical aperture; and
         the port shield being connected to the metallization layer and a chassis ground via the metallization layer; wherein the port shield has a funnel shape, including a wide end attached to a portion of the metallization layer within the barrel cavity and a narrow end defining the port shield aperture.

14. The optoelectronic module of claim 13, wherein the wide end of the port shield is attached to the portion of the metallization layer by mechanical interference or conductive epoxy.

* * * * *